(12) United States Patent
Chuang et al.

(10) Patent No.: US 11,031,267 B2
(45) Date of Patent: Jun. 8, 2021

(54) METHOD AND SYSTEM OF MEASURING AIR-TIGHTNESS AND CONTAINER MEASURED THEREBY

(71) Applicant: Gudeng Precision Industrial Co., LTD, New Taipei (TW)

(72) Inventors: Chia-Ho Chuang, New Taipei (TW); Shu-Hung Lin, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 146 days.

(21) Appl. No.: 16/039,689

(22) Filed: Jul. 19, 2018

(65) Prior Publication Data

US 2019/0051549 A1 Feb. 14, 2019

Related U.S. Application Data

(60) Provisional application No. 62/544,996, filed on Aug. 14, 2017.

(51) Int. Cl.
*H01L 21/673* (2006.01)
*G01M 3/00* (2006.01)
(Continued)

(52) U.S. Cl.
CPC ........ *H01L 21/67389* (2013.01); *B65D 85/48* (2013.01); *G01M 3/00* (2013.01);
(Continued)

(58) Field of Classification Search
CPC ......... H01L 21/67389; H01L 21/67359; H01L 21/67376; B65D 85/48; G01M 3/00; G03F 1/66; G03F 7/70741
(Continued)

(56) References Cited

U.S. PATENT DOCUMENTS 5,489,987 A * 2/1996 Ringlien ............ G01N 21/9054
356/428
7,400,383 B2 * 7/2008 Halbmaier ........ H01L 21/67389
206/449
(Continued)

FOREIGN PATENT DOCUMENTS

| JP | 1999-183134 A | 7/1999 |
|---|---|---|
| KR | 10-0994741 B1 | 11/2010 |
| TW | I391304 | 4/2013 |

*Primary Examiner* — Alexander A Mercado
*Assistant Examiner* — Monica S Young
(74) *Attorney, Agent, or Firm* — WPAT, PC (57) ABSTRACT

A method and a system of measuring air-tightness and a container measured thereby are provided. In the method, a first cover having a first contact surface and a first base having a second contact surface are provided. The two contact surfaces are used for engaging with each other to form an air-tight state. Further, a first contour curve relating to the first contact surface and a second contour curve relating to the second contact surface are acquired. Then, the two contour curves are brought into contact with each other, and the area of a first gap between the two curves is determined. When the area of the first gap is equal to or smaller than a threshold, the first cover and the first base are paired as a first combination of acceptable air-tightness so as to form the container.

10 Claims, 11 Drawing Sheets

(51) Int. Cl.
*G03F 1/66* (2012.01)
*B65D 85/48* (2006.01)
*G03F 7/20* (2006.01)

(52) U.S. Cl.
CPC ............ *G03F 1/66* (2013.01); *G03F 7/70741* (2013.01); *H01L 21/67359* (2013.01); *H01L 21/67376* (2013.01)

(58) Field of Classification Search
USPC .......................................................... 73/105
See application file for complete search history.

(56) References Cited

U.S. PATENT DOCUMENTS

| | | | | |
|---|---|---|---|---|
| 7,607,543 | B2* | 10/2009 | Gregerson | G03F 1/66 206/710 |
| 8,231,005 | B2* | 7/2012 | Kolbow | G03F 1/66 206/710 |
| 8,403,143 | B2* | 3/2013 | Chiu | H01L 21/67359 206/454 |
| 9,022,216 | B2* | 5/2015 | Ku | B65D 85/48 206/454 |
| 10,677,582 | B2* | 6/2020 | Boira Bonhora | G01N 21/9054 |
| 2004/0085311 | A1* | 5/2004 | Lee | G06T 17/30 345/419 |
| 2006/0087639 | A1* | 4/2006 | Puerto | G03F 9/7011 355/75 |
| 2006/0127205 | A1* | 6/2006 | Chiu | G03F 1/66 414/416.01 |
| 2007/0200476 | A1* | 8/2007 | Kijima | H01J 29/862 313/308 |
| 2007/0296963 | A1* | 12/2007 | Parker | G01N 21/55 356/240.1 |
| 2009/0027397 | A1* | 1/2009 | Frisken | G06K 9/00416 345/442 |
| 2009/0199963 | A1* | 8/2009 | Ohashi | H01J 9/261 156/273.9 |
| 2010/0201519 | A1* | 8/2010 | Dagher | B65D 90/22 340/561 |
| 2010/0294397 | A1* | 11/2010 | Kishkovich | H01L 21/67017 141/66 |
| 2012/0073727 | A1* | 3/2012 | Matsumoto | H01J 9/261 156/109 |
| 2013/0278927 | A1* | 10/2013 | Johnson | B67B 1/00 356/240.1 |
| 2015/0241360 | A1* | 8/2015 | Niemela | G01N 21/9508 356/369 |
| 2018/0210349 | A1* | 7/2018 | Hsueh | G03F 7/70741 |

* cited by examiner

METHOD AND SYSTEM OF MEASURING AIR-TIGHTNESS AND CONTAINER MEASURED THEREBY

RELATED APPLICATIONS

This application claims priority to U.S. Provisional Patent Application, No. 62/544,996, by Chuang, et al., titled "Method of Measuring Air-Tightness," filed Aug. 14, 2017 which is hereby incorporated by reference herein in their entirely.

BACKGROUND OF THE INVENTION

Technical Field

The present invention relates to a method and a system of measuring air-tightness and a container measured thereby. More particularly, the present invention relates to a method and a system of measuring air-tightness of engaged cover and base of a container and the container measured by the air-tightness method and system.

Description of Related Art

The semiconductor manufacturing technology advances rapidly in recent years. Of the manufacturing processes, the photolithography process plays an important role. Photolithography involves fabricating a light permeable reticle with predefined pattern, and then projecting the pattern onto a wafer by exposing to a light source so as to develop the pattern on the wafer. During the photolithography process, any particles attached on the reticle, such as dust or organic matters, would deteriorate the image quality projected onto the wafer. Therefore, the reticle used in the photolithography process or any other articles related to the semiconductor manufacturing process have to be kept at a relative high level of cleanliness throughout the manufacturing, handling, transporting, and storing process.

One known method of storing the article is using a container having an upper portion and a lower portion that cooperate with each other. As the two portions contact with each other, the contact surface on the upper portion engages with the contact surface on the lower portion to form an air-tight state. The inside and the outside of the container can therefore be separated, to and the dust or particles outside the container are prevented from moving into the container so as not to contaminate the article contained in the container. In order to determine whether the container meets the air-tightness requirement, the container will be tested after it is produced. Normally, the container undergoes precise and high standard production process, and the two contact surfaces of the upper and the lower portions are flat surfaces that meet the requirements relating to the flatness of the surfaces.

It is known to a person skilled in the art to use a surface finish with a roughness average as an index to evaluate the flatness of the surface. For example, a process for assembling a door is disclosed in the specification of Taiwan patent No. 1391304 titled "RETICLE POD" which was issued on 2013 Apr. 1. The process of assembling the door includes a step of lapping or polishing the major surface to a prescribed flatness and finish specification. When the cover is mated to the door, the seal-contact surface engages the rigid sealing surface to create a seal. The seal-contact surface and the sealing surface may be aluminum with, for example, an electro less nickel finish. Generally, a surface finish with a roughness average (RA) of up to 0.50 micro inches is acceptable with the preferred range being from 0.20-0.40 RA (page 29 of the specification). In addition, it is also disclosed in the specification of U.S. Pat. No. 8,231,005 B titled "RETICLE POD" which was issued on 2012 Jul. 31 that RA of up to 0.50 micro inches is acceptable with the preferred range being from 0.20-0.40 RA (column 22).

When the upper portion or the lower portion fails to meet the requirement of surface flatness, it means the container formed by the upper portion and lower portion will not reach the expected air-tightness, and therefore the container is unsuitable for being used as the high cleanliness container for articles related to the semiconductor manufacturing process. The cost will increase drastically whether the container is wasted or reworked. Moreover, in order to meet the relative strict standard of roughness average, the processing cost of the upper portion and the lower portion is also inevitably increased. On the other hand, the air-tightness test of the container is conducted in an equipment having a vacuum chamber, to apply pressure differences between the inside and the outside of the container. The test process is time consuming, especially when a massive amount of containers are waiting to be tested. Therefore, the manufacturers are in the need for a more efficient way to perform the air-tightness test.

SUMMARY

In view of the above-mentioned problems, the present invention is to provide a method and a system of measuring air-tightness and a container measured thereby. The air-tight property of the cover and base of the container can be determined by the gap area between two contour curves of two engaging contact surfaces.

According to one aspect of the invention, a method of measuring air-tightness is provided. The method includes the following steps. First, a first cover and a first base for cooperating with each other are provided. The first cover has a first contact surface and the first base has a second contact surface for engaging with the first contact surface to form an air-tight state. Second, a first contour curve relating to the first contact surface is acquired, and a second contour curve relating to the second contact surface is acquired. Then, the first contour curve is brought into contact with the second contour curve. Further, a first gap area between the first contour curve and the second contour curve is determined. Afterwards, the first cover and the first base are paired as a first combination of acceptable air-tightness when the first gap area is equal to or smaller than a threshold, thereby forming a first container.

In one embodiment of the invention, the step of acquiring the first contour curve relating to the first contact surface includes the following sub-steps. First, a first start point is defined on the first contact surface. Then, more than one first heights are sequentially obtained at a fixed interval by following a first measuring path on the first contact surface starting from the first start point. The first contour curve is acquired based on the first heights. The step of acquiring the second contour curve relating to the second contact surface includes the following sub-steps. First, a second start point is defined on the second contact surface. Then, more than one second heights are sequentially obtained at the fixed interval by following a second measuring path on the second surface starting from the second start point. The second contour curve is acquired based on the second heights. When the first contact surface is engaged with the second contact surface, the first start point overlaps with the second start point and the first measuring path overlaps with the second measuring path.

In another embodiment of the invention, the method further includes the following steps. First, a second cover is provided when the first gap area is larger than the threshold. The second cover has a third contact surface. Second, a third contour curve relating to the third contact surface is acquired. Then, the third contour curve is brought into contact with the second contour curve. Further, a second gap area between the third contour curve and the second contour curve is determined. Afterwards, the second cover and the first base are paired as a second combination of acceptable air-tightness when the second gap area is equal to or smaller than the threshold, thereby forming a second container.

In yet another embodiment of the invention, the method further includes the following steps. First, a second base is provided when the first gap area is larger than the threshold. The second base has a fourth contact surface. Second, a fourth contour curve relating to the fourth contact surface is acquired. Then, the fourth contour curve is brought into contact with the first contour curve. Further, a third gap area between the fourth contour curve and the first contour curve is determined. Afterwards, the first cover and the second base are paired as a third combination of acceptable air-tightness when the third gap area is equal to or smaller than the threshold, thereby forming a third container.

According to another aspect of the invention, a system of measuring air-tightness of a cover and a base is provided. The cover has a first contact surface and the base has a second contact surface for engaging with the first contact surface to form an air-tight state. The system includes a measuring unit and a processing unit. The measuring unit is used for acquiring a first contour curve relating to the first contact surface and for acquiring a second contour curve relating to the second contact surface. The processing unit is used for determining a gap area between the first contour curve and the second contour curve as the two contour curves are brought into contact with each other. The processing unit is used for pairing the cover and the base as a combination of acceptable air-tightness when the gap area is equal to or smaller than a threshold.

According to yet another embodiment of the invention, a container is provided. The container includes a cover and a base for cooperating with each other to contain a reticle within the container. The cover has a first contact surface and the base has a second contact surface for engaging with the first contact surface to form an air-tight state. The cover and the base are paired through a method of measuring air-tightness which includes the following steps. First, a first contour curve relating to the first contact surface is acquired. Second, a second contour curve relating to the second contact surface is acquired. Then, the first contour curve is brought into contact with the second contour curve. Moreover, a gap area between the first contour curve and the second contour curve is determined. Afterwards, the cover and the base are paired as a combination of acceptable air-tightness when the gap area is equal to or smaller than a threshold, thereby forming the container.

According to the disclosure of the embodiments of the invention, after the first contour curve and the second contour curve are acquired, the first gap area between the two contacted contour curves is determined. When the first gap area is equal to or smaller than the threshold, the first cover and the first base are paired as a first combination of acceptable air-tightness. In this manner, by acquiring and using the contour curves, the air-tightness of the cover and the base can be determined, and the effect of selectively matching the cover with the base can be realized. The processing cost of the cover and base can be lowered, and the air-tight property of the matched cover and the base can be improved. Further, the variation of air-tightness across different cover-and-base combinations can be reduced, and the air-tightness measuring to efficiency can be improved.

BRIEF DESCRIPTION OF DRAWINGS

The invention can be more fully understood by reading the following detailed description of the embodiment, with reference made to the accompanying drawings as follows.

DETAILED DESCRIPTION

In the method and the system of measuring air-tightness and the container measured thereby according to the embodiments of the invention, the air-tightness between a cover and a base of the container is measured by using the contour curves of the two engaged contact surfaces. The air-tightness can be effectively determined, and one or more combinations of acceptable air-tightness among different covers and different bases can be found. The effect of selectively matching the cover with the base can be realized. The features of the embodiments of the invention will be elaborated below with the accompanying drawings. The drawings are for exemplary purpose only, they are not depicted as the exact sizes or proportions, and some elements are simplified or omitted in the drawings to clearly show the features of the invention.

Figure 1A:
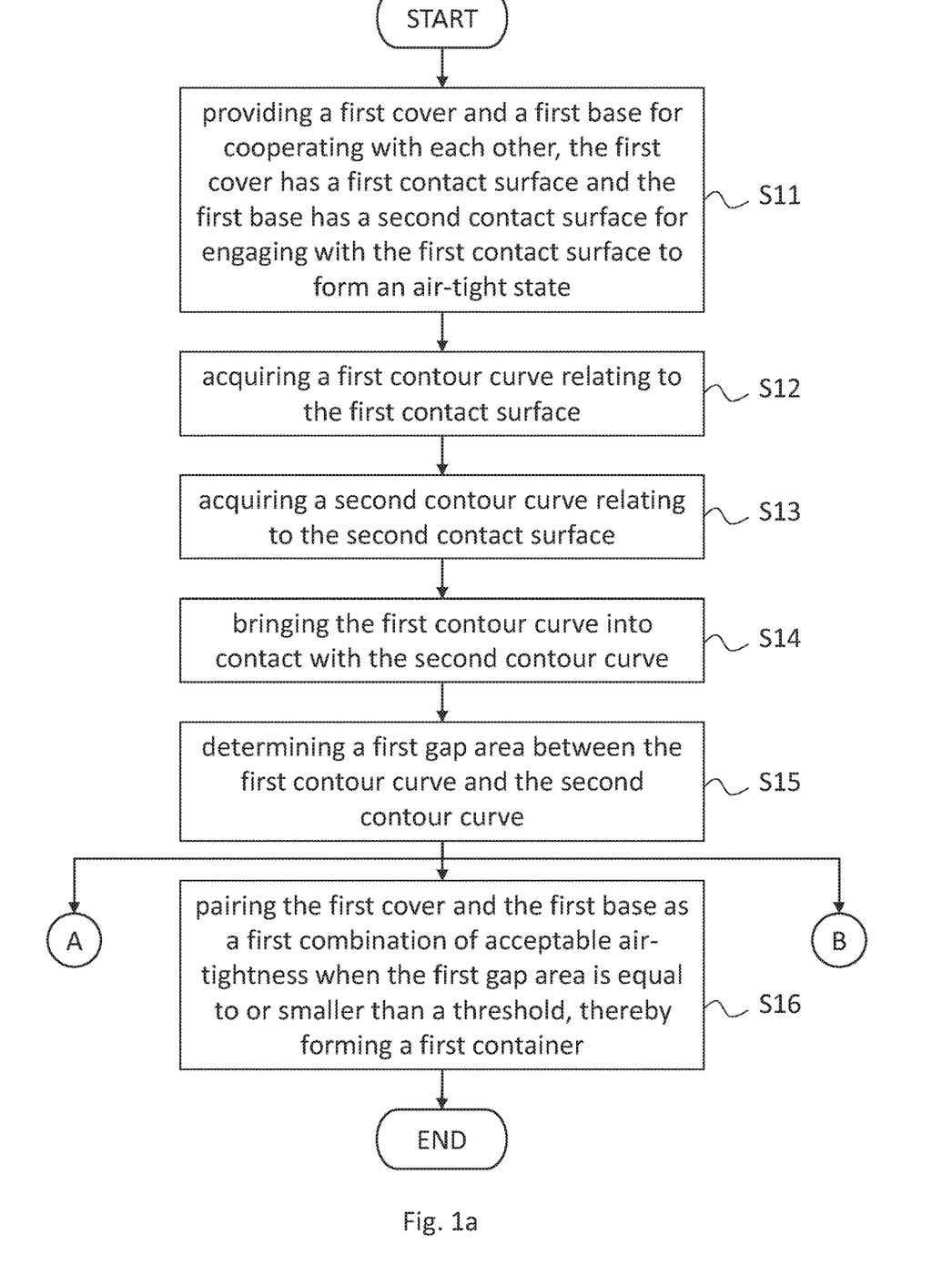
FIGS. 1a-1c show the flow chart of a method of measuring air-tightness according to one embodiment of the invention.
Figure 1B:
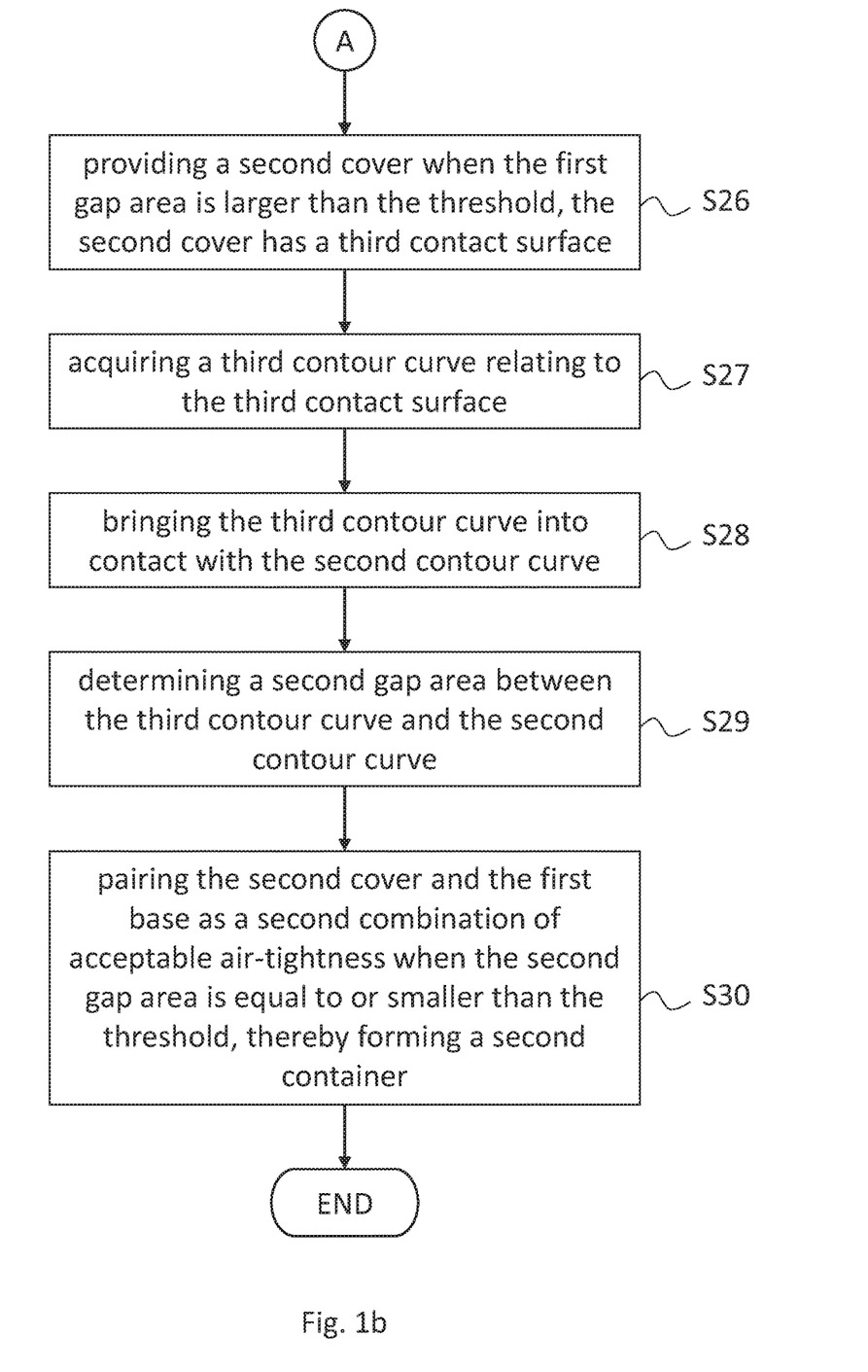
Figure 1C:
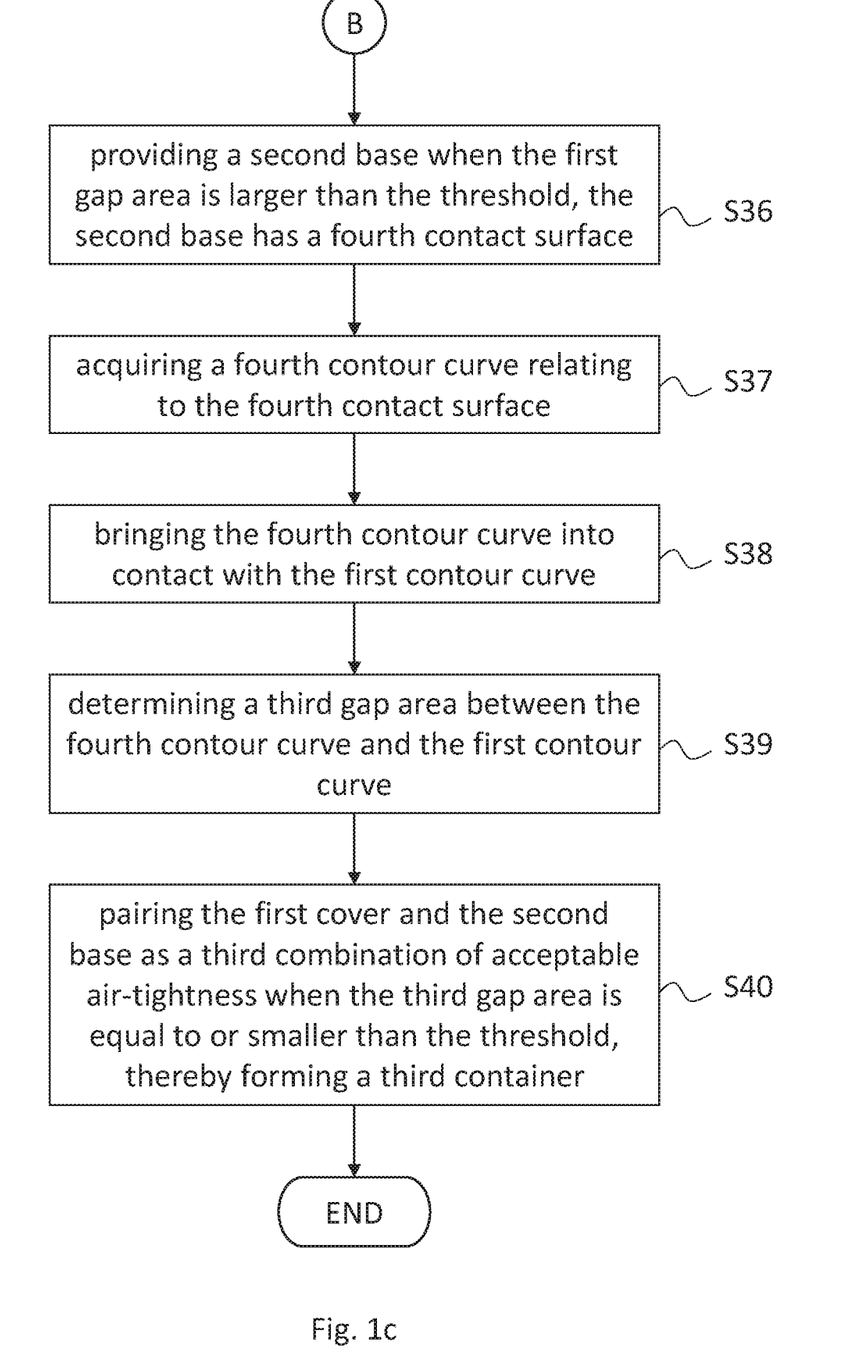

Please refer to FIGS. 1a-1c, which show the flow chart of a method of measuring air-tightness according to one embodiment of the invention. Firstly, the method of measuring air-tightness of the present embodiment performs step S11 where a first cover and a first base are provided.

Figure 2:
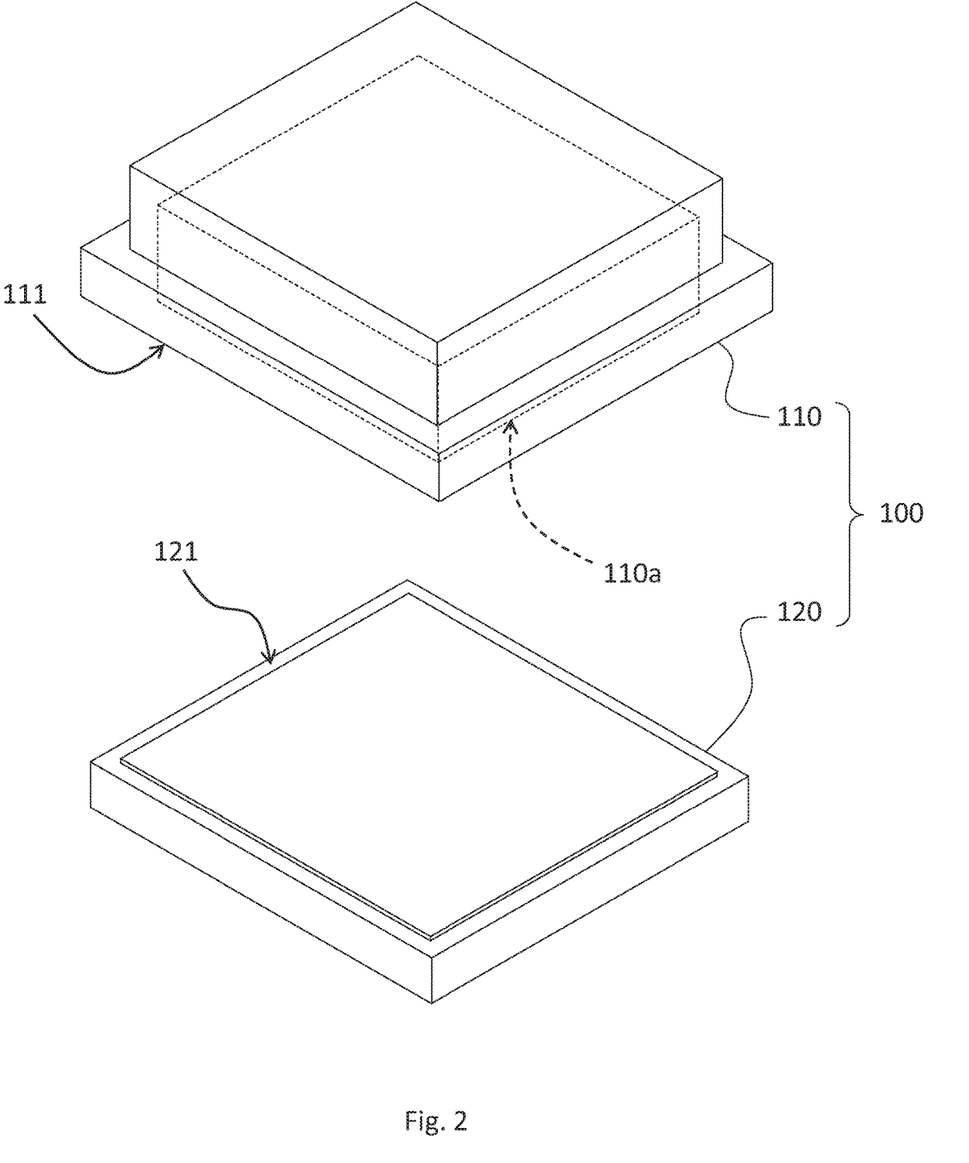
FIG. 2 is a schematic diagram showing the first cover and the first base according to one embodiment of the invention.
Figure 3A:
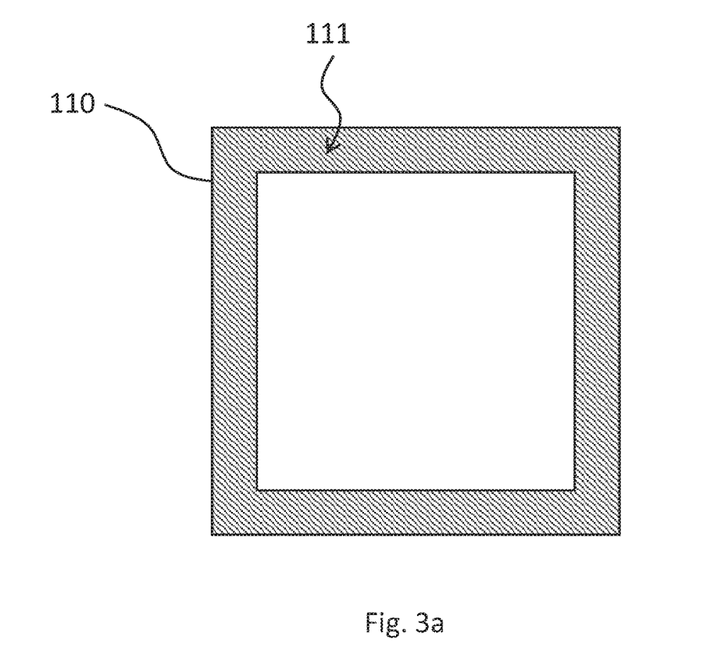
FIG. 3a is a bottom view of the first cover in FIG. 2.
Figure 3B:
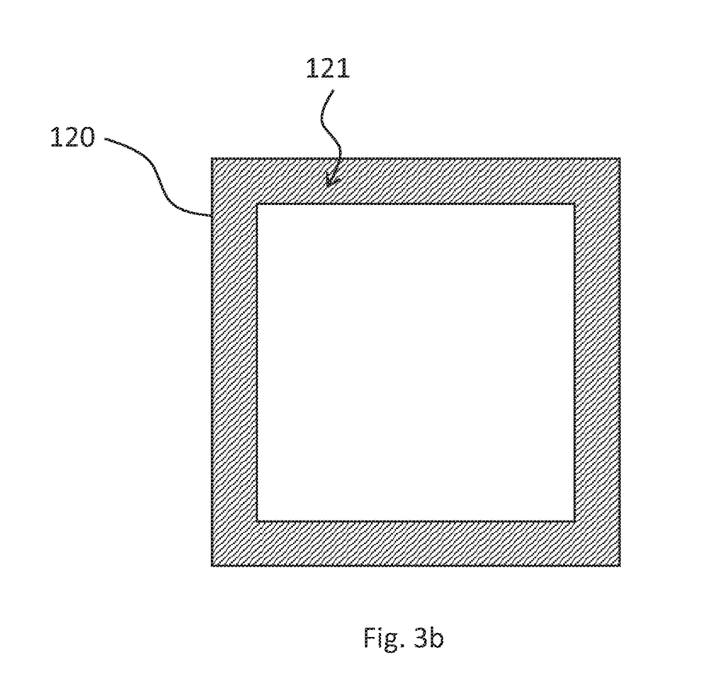
FIG. 3b is a top view of the first base in FIG. 2.

Please refer to FIGS. 2, 3a, and 3b at the same time. FIG. 2 is a schematic diagram showing the first cover and the first base according to one embodiment of the invention. FIG. 3a is a bottom view of the first cover in FIG. 2, and FIG. 3b is a top view of the first base in FIG. 2. The first cover 110 and the first base 120 cooperate with each other in the present embodiment to form a container 100. Particularly, the container 100 is the one that demands a relative high air-tight property, such as the container that is used to contain the articles related to the semiconductor manufacturing process. The container 100 can be exemplified by a reticle pod of a reticle in one embodiment. The first cover 110 has a first contact surface 111 and the first base 120 has a second contact surface 121. The first contact surface 111 is used for engaging with the second contact surface 121 to form an air-tight state.

In the present embodiment, when the first base 120 is coupled with the first cover 110, an accommodation space 100a is formed between them, and an article (such as a reticle) can be contained in the accommodation space 100a. The first contact surface 111 is a circular-shaped flat surface, and so is the second contact surface 121. When the first contact surface 111 engages with the second contact surface 121, the air-tight state is formed to separate the accommodation space 100a from the external environment of the container 100.

The method of measuring air-tightness of the present embodiment continues to step S12. A first contour curve relating to the first contact surface 111 is acquired. The step of acquiring the first contour curve (step S12) of the present embodiment can be performed by the following sub-steps. First, a first start point is defined on the first contact surface 111. Then, more than one first heights are sequentially obtained at a fixed interval by following a first measuring path on the first contact surface 111. The first measuring path starts from the first start point. The first contour curve is acquired based on the first heights.

Figure 4:
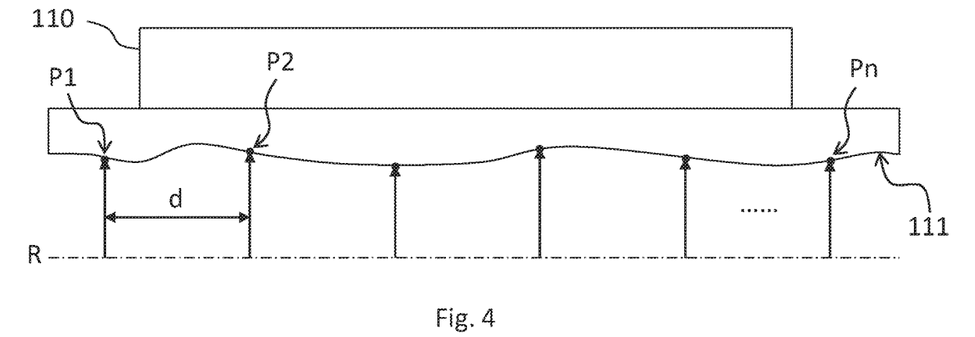
FIG. 4 is a schematic diagram showing the obtained first heights on the first contact surface.
Figure 5:
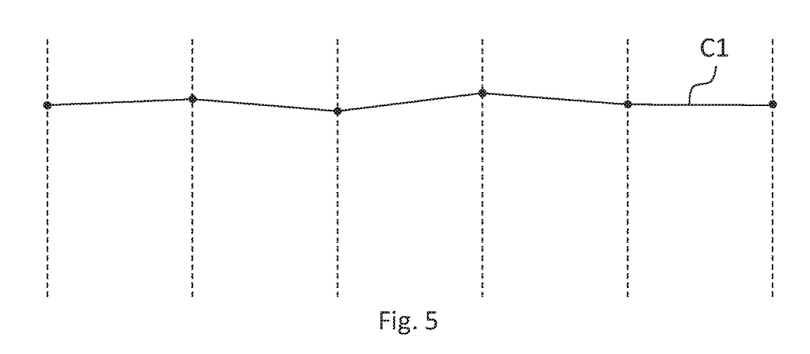
FIG. 5 is a schematic diagram showing the first contour curve.

Please refer to FIGS. 4 and 5 at the same time. FIG. 4 is a schematic diagram showing the obtained first heights on the first contact surface, and FIG. 5 is a schematic diagram showing the first contour curve. Exemplarily, the first heights are obtained at different locations on the first contact surface 111 by a coordinate measuring machine (CMM). To be more specific, in the method of the present embodiment, the first start point is defined on the first contact surface 111, and then the first heights of more than one measure points P1-Pn are sequentially obtained by following the first measuring path starting from the first start point. Every two adjacent measure points P1-Pn are separated by the fixed interval d, and the first measure point P1 is the first star point. In the coordinate system of the first heights and the measure points P1-Pn, the first contour curved C1 can be formed based on the first heights, as shown in FIG. 5.

In the present embodiment, the first heights are the vertical distances measuring from a reference surface R to the measure points P1-Pn on the first contact surface 111 respectively. In a different embodiment, the reference surface R can be the top surface of the first cover 110, so that the first heights of the measure points P1-Pn on the first contact surface 111 can be obtained. However, the feature of the invention is not limited hereto; other methods for obtaining the heights relating to the measure points P1-Pn are applicable in the present invention.

Figure 6:
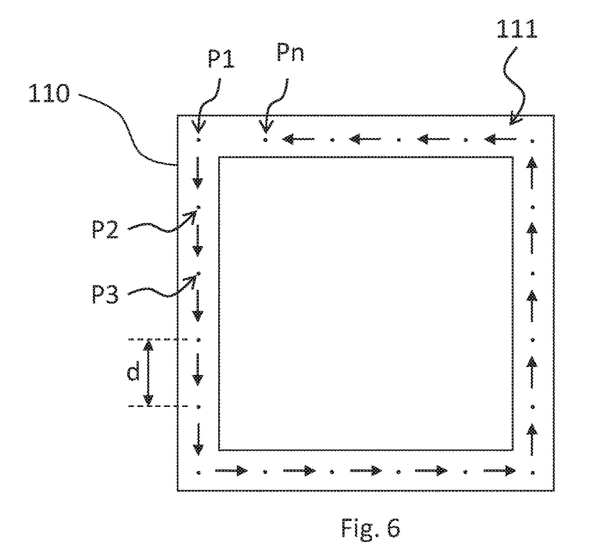
FIG. 6 is a schematic diagram showing the distribution of the measure points on the first contact surface.

Please refer to FIG. 6, which is a schematic diagram showing the distribution of the measure points on the first contact surface. In the present embodiment, the first heights of the measure points P1-Pn are sequentially obtained at the fixed interval d by following the first measure path on the first contact surface 111 along the circular-shaped first contact surface 111. The fixed interval d can be adjusted in accordance with practical situations. For example, the fixed interval d can be reduced so that the number of the measure points P1-Pn can be increased, and the acquired first contour curve C1 can be better conformed to the actual contour of the first contact surface 111. On the other hand, the fixed interval d can be increased so that the number of the measure points P1-Pn can be reduced, and the measuring efficiency can be improved by having fewer measure points P1-Pn. The overall time consumed by the batch measurement of numerous containers 100 can be shortened.

Figure 7A:
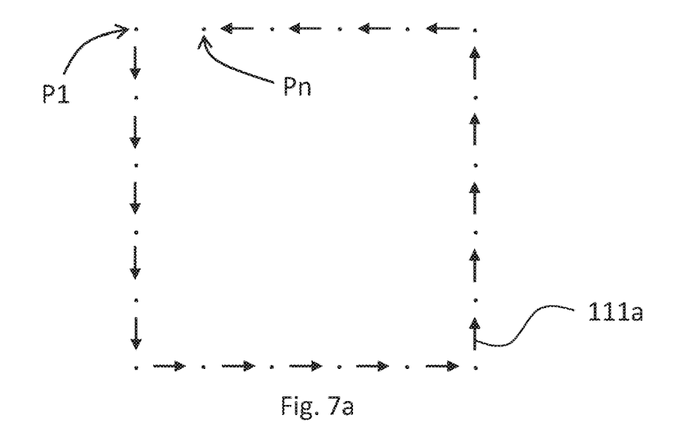
FIG. 7a is a schematic diagram showing the first measuring path on the first contact surface according to one embodiment of the invention.

Please refer to FIG. 7a, which is a schematic diagram showing the first measuring path on the first contact surface according to one embodiment of the invention. Exemplarily, the measure points P1-Pn in FIG. 7a are arranged in the same way as in FIG. 6. The measurement starts from the first measure point P1 and then moves along the first measuring path 111a (formed by the linked arrows in FIG. 7a) to the last measure point Pn. The measure points P1-Pn are arranged equidistantly. In the embodiment shown in FIG. 7a, the first measure point P1 and the last measure point Pn are different points. The first measuring path 111a does not constitute a continuous loop. On the contrary, in a different embodiment, the first measure point P1 and the last measure point Pn are the same point. Please refer to FIG. 7b, which is a schematic diagram showing the first measuring path on the first contact surface according to another embodiment of the invention. The start point and the end point of the first measuring path 111a' are the same point, so that the first measuring path 111a' constitute a continuous loop.

Figure 7B:
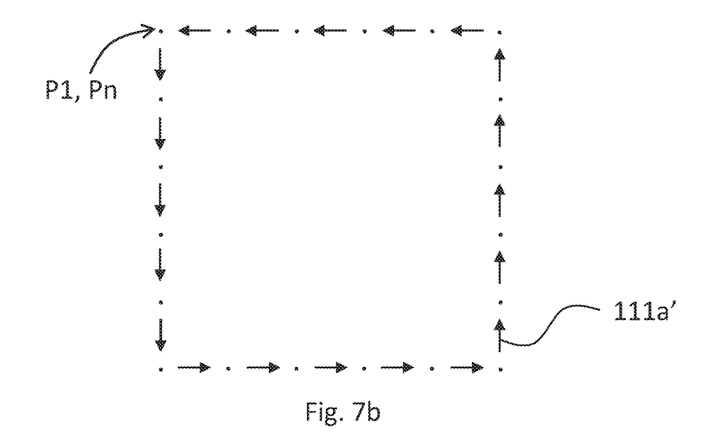
FIG. 7b is a schematic diagram showing the first measuring path on the first contact surface according to another embodiment of the invention.
Figure 7C:
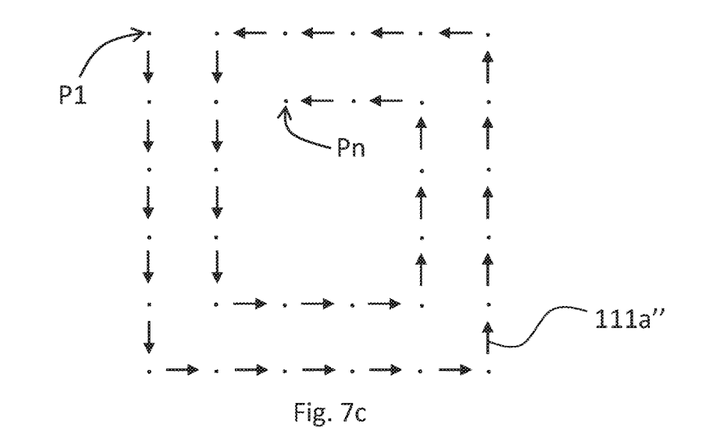
FIG. 7c is a schematic diagram showing the first measuring path on the first contact surface according to yet another embodiment of the invention.

However, in the present invention, the measure points P1-Pn are not limited to the way they are arranged in FIGS. 6, 7a and 7b. The measure points P1-Pn can also be arranged in the shape of a multi-layer circle or a matrix. Please refer to FIG. 7c, which is a schematic diagram showing the first measuring path on the first contact surface according to yet another embodiment of the invention. The measure points P1-Pn are arranged in the shape of a dual layer circle. The first measuring path 111a" starts from the first measure point P1, ends at the last measure point Pn, and forms a spiral shape. Generally, the arrangement or distribution of the measure points P1-Pn and the shape of the first measuring path 111a" are not limited in the present invention. The amount, density, and arrangement of the measure points P1-Pn can be adjusted according to actual needs. The first measuring path 111a' can be defined based on the type and the ability of the measuring device. Any other measuring methods that sequentially obtain multiple first heights from the first measure point P1 to the last measure point Pn on the first contact surface 111, to consequently acquire the first contour curve C1, fall within the scope of the present invention.

Figure 8:
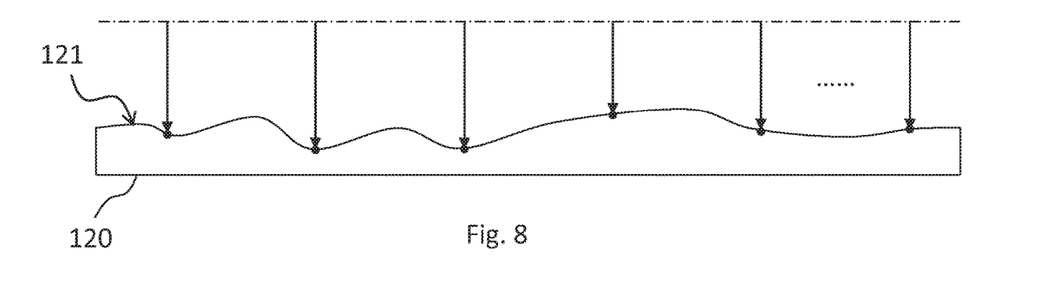
FIG. 8 is a schematic diagram showing the obtained second heights on the second contact surface.
Figure 9:
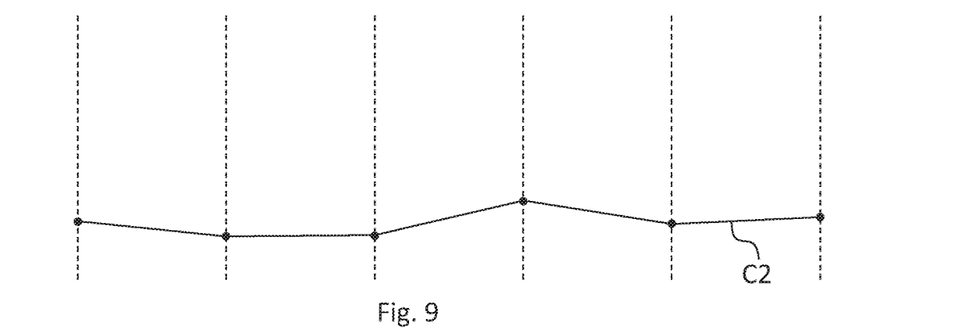
FIG. 9 is a schematic diagram showing the second contour curve.

The method of measuring air-tightness of the present embodiment continues to step S13. A second contour curve relating to the second contact surface 121 is acquired. Please refer to FIGS. 8 and 9 at the same time. FIG. 8 is a schematic diagram showing the obtained second heights on the second contact surface. FIG. 9 is a schematic diagram showing the second contour curve. The step of acquiring the second first contour curve (step S13) can be performed by the following sub-steps. First, a second start point is defined on second first contact surface 121. Then, more than one second heights are sequentially obtained at the fixed interval d by following a second measuring path on the second contact surface 121. The second measuring path starts from the second start point. The second contour curve C2 is acquired based on the second heights.

Similar to step S12, the second heights can be obtained at different locations on the second contact surface 121 by the coordinate measuring machine in step S13. The second start point is defined on the second contact surface 121, and then the second heights of more than one measure points are sequentially obtained by following the second measuring path starting from the second start point. Every two adjacent measure points are separated by the fixed interval d, and the first measure point is the second star point. In the coordinate system of the second heights and the measure points, the second contour curved C2 can be formed based on the second heights.

In step S13, the location of the second start point corresponds to the location of the first start point (the first measure point P1 on the first contact surface 111). The fixed interval d of obtaining the second heights on the second contact surface 121 is the same as the fixed interval d on the first contact surface 111. The number of the measure points on the second contact surface 121 equals to the number of measure points on the first contact surface 111. When the first contact surface 111 engages with the second contact surface 121, the first start point overlaps with the second start point, the first measuring path 111a overlaps with the second measuring path, and every measure point P1-Pn on the first contact surface 111 overlaps with its corresponding measure point on the second contact surface 121.

Figure 10:
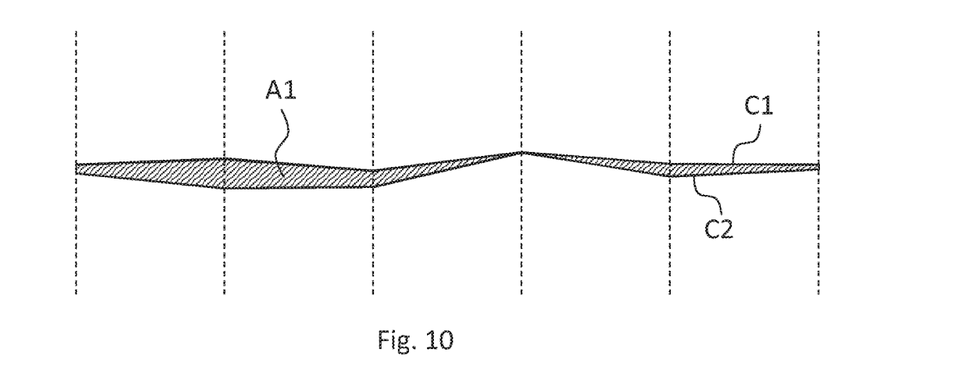
FIG. 10 is a schematic diagram showing the first and the second contour curves that are in contact with each other.

The method of measuring air-tightness of the present embodiment moves on to step S14 after the first contour curve C1 and the second contour curve C2 are acquired in step S12 and step S13. In step S14, the first contour curve C1 is brought into contact with the second contour curve C2. Please refer to FIG. 10, which is a schematic diagram showing the first and the second contour curves that are in contact with each other. A first gap, shown as the shaded area in FIG. 10, is formed between the first contour curve C1 and the second contour curve C2. The first contour curve C1 touches the second contour curve C2 at a single point in the present embodiment. As shown in FIG. 10, it is the fourth measure point from the left where the two contour curve C1 and C2 contact. Practically, the first contour curve C1 may touch the second contour curve C2 at more than one points, based on different measuring results.

In the method of the present embodiment, step S15 is performed after step S14. A first gap area A1 between the first contour curve C1 and the second contour curve C2 is determined. In the six-measure-point embodiment, the space between the measure points on the first contour curves C1 and the second contour curve C2 is a combination of triangles and trapezoids. In step S15, the first gap area A1 is determined by calculating the total area of the triangles and trapezoids.

After the first gap area A1 is determined, it is compared with a threshold. When the first gap area A1 is equal to or smaller than the threshold, it means the first contour curve C1 is relatively well matched with the second contour curve C2. The first contact surface 111 and the second contact surface 121 can achieve an acceptable air-tight property. The threshold can be determined by the degree of air-tightness that the container 100 needs to achieve, and the threshold is in a positive correlation with the air-tightness of the container 100.

When the first gap area A1 is equal to or smaller than the threshold, the method of the present embodiment moves on to step S16. The first cover 110 and the first base 120 are paired as a first combination of acceptable air-tightness. A first container (i.e. the container 100 in FIG. 2) that achieves desired or better air-tightness is formed by the first cover 110 and the first base 120.

On the other hand, when the first gap area A1 is larger than the threshold, it means the combination of first cover 110 and the first base 120 cannot achieve desired air-tightness. In the method of the present embodiment, another cover can be selected to match with the first base 120 to measure their air-tight property.

Figure 11:
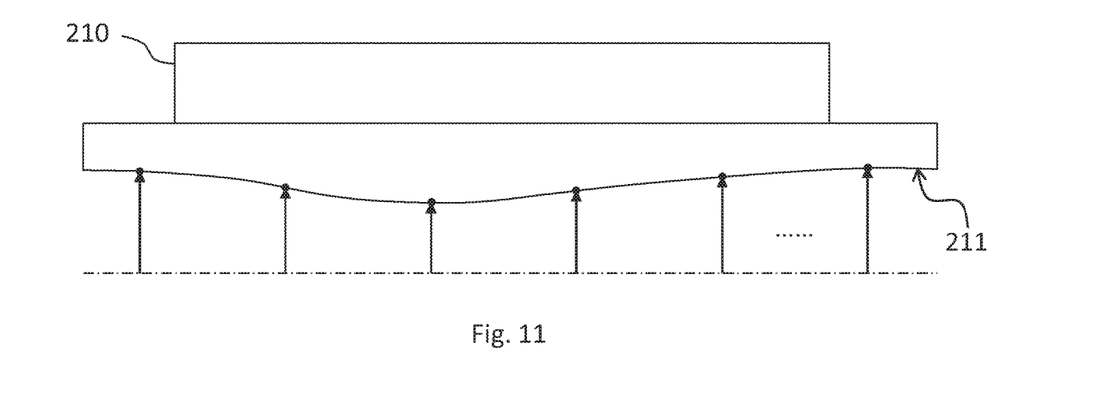
FIG. 11 is a schematic diagram showing the second cover according to one embodiment of the invention.
Figure 12:
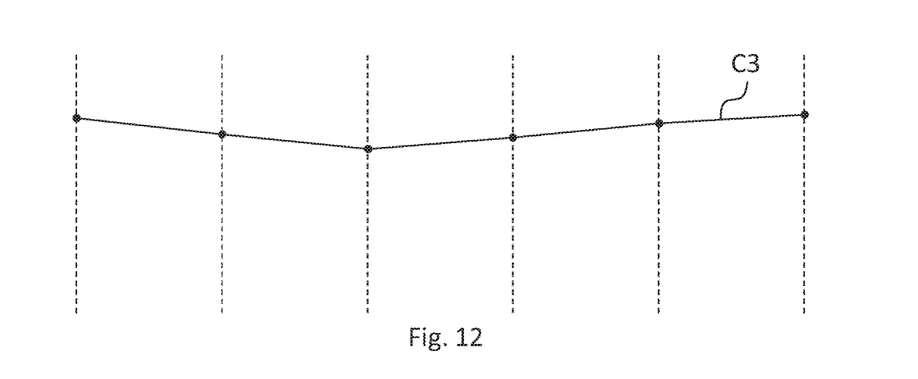
FIG. 12 is a schematic diagram showing the third contour curve.
Figure 13:
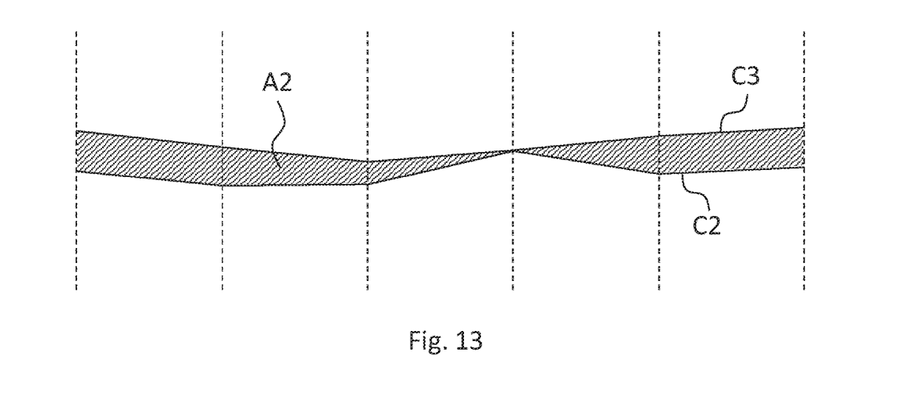
FIG. 13 is a schematic diagram showing the third and the second contour curves that are in contact with each other.

Please refer to FIGS. 1b and 11-13 at the same time. FIG. 11 is a schematic diagram showing the second cover according to one embodiment of the invention. FIG. 12 is a schematic diagram showing the third contour curve. FIG. 13 is a schematic diagram showing the third and the second contour curves that are in contact with each other. As shown in step S26, when the first gap area A1 is larger than the threshold, a second cover 210 is provided. The second cover 210 has a third contact surface 211 for engaging with the second contact surface 121 to form an air-tight state. Then in step S27, a third contour curve C3 relating to the third contact surface 211 is acquired. In step S28, the third contour curve C3 is brought into contact with the second contour curve C2. Afterwards, in step S29, a second gap area A2 between the second contour curve C2 and the third contour curve C3 is determined. The contents of steps S27-S29 are similar to those of the previously described steps S12, S14, and S15, and they will not be repeated here.

When the second gap area A2 is equal to or smaller than the threshold, the method of the present embodiment continues to step S30. The second cover 210 and the first base 120 are paired as a second combination of acceptable air-tightness. A second container that achieves desired or better air-tightness is formed by the second cover 210 and the first base 120. When the second gap area A2 is larger than the threshold, it means the combination of the second cover 210 and the first base 120 cannot achieve desired air-tightness. Still another cover can be selected to match with the first base 120 to measure their air-tight property. Then the steps of acquiring contour curve and determining gap area are repeated.

On the other hand, after step S15 is performed, when the first gap area A1 is larger than the threshold, it means combination of first cover 110 and the first base 120 cannot achieve desired air-tightness. In the method of the present embodiment, another base can be selected to match with the first cover 110 to measure their air-tight property.

Figure 14:
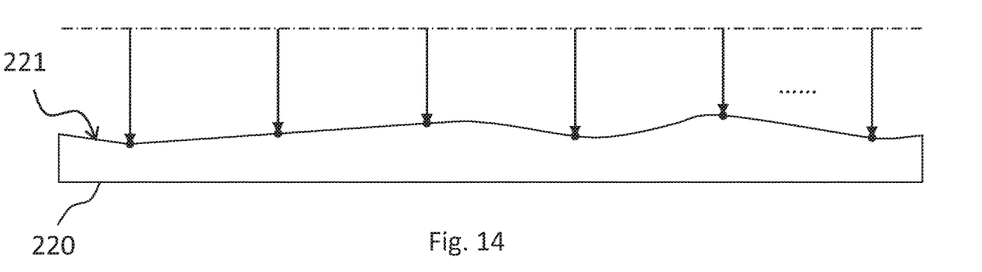
FIG. 14 is a schematic diagram showing the second base according to one embodiment of the invention.
Figure 15:
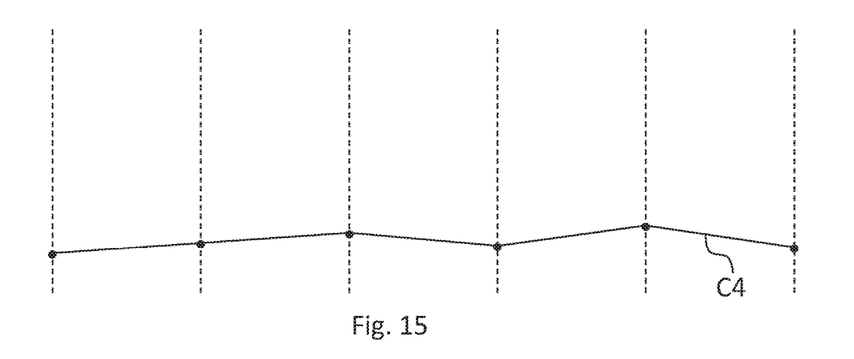
FIG. 15 is a schematic diagram showing the fourth contour curve.
Figure 16:
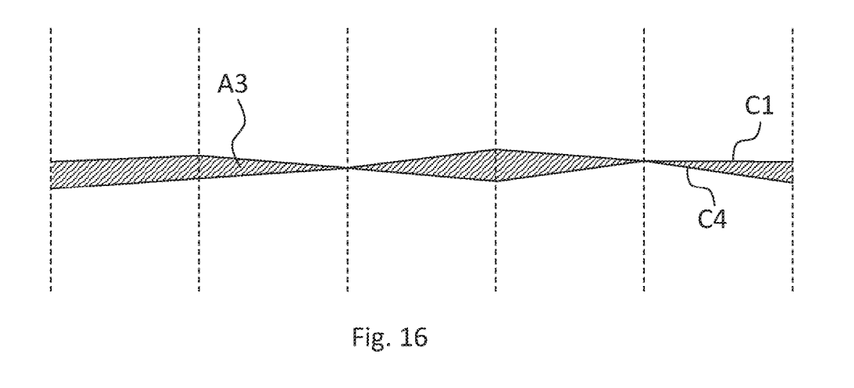
FIG. 16 is a schematic diagram showing the first and the fourth contour curves that are in contact with each other.

Please refer to FIGS. 1c and 14-16 at the same time. FIG. 14 is a schematic diagram showing the second base according to one embodiment of the invention. FIG. 15 is a schematic diagram showing the fourth contour curve. FIG. 16 is a schematic diagram showing the first and the fourth contour curves that are in contact with each other. As shown in step S36, when the first gap area A1 is larger than the threshold, a second base 220 is provided. The second base 220 has a fourth contact surface 221 for engaging with the first contact surface 111 to form an air-tight state. Then in step S37, a fourth contour curve C4 relating to the fourth contact surface 221 is acquired. In step S38, the fourth contour curve C4 is brought into contact with the first contour curve C1. Afterwards, in step S39, a third gap area A3 between the fourth contour curve C4 and the first contour curve C1 is determined. The contents of steps S37-S39 are similar to those of the previously described steps S12, S14, and S15, and they will not be repeated here.

When the third gap area A3 is equal to or smaller than the threshold, the method of the present embodiment continues to step S40. The first cover 110 and the second base 220 are paired as a third combination of acceptable air-tightness. A third container that achieves desired or better air-tightness is formed by the first cover 110 and the second base 220. When the third gap area A3 is larger than the threshold, it means the combination of the first cover 110 and the second base 220 cannot achieve desired air-tightness. Still another base can be selected to match with the first cover 110 to measure their air-tight property. Then the steps of acquiring contour curve and determining gap area are repeated.

According to the above mentioned method of measuring air-tightness, after the first contour curve relating to the first contact surface and the second contour curve relating to the second contact surface are acquired, the first gap area between the two curves can be used to determine whether the air-tightness is acceptable or not. When the first gap area is equal to or smaller than the threshold, the first cover and the first base are paired as a first combination of acceptable air-tightness. The container formed by the first cover and the first base meets the desired or better air-tight property. In the present embodiment of the invention, the measuring method for the air-tight property of the cover and the base can be more efficient and can be simplified by using the contour curves. When the air-tightness fails to meet the requirement, simply use another cover or another base to conduct air-tightness measuring. The problem of the cost increment due to wasting the container as the cover-base-combination fails the air-tightness test can be avoided.

According to the related art mentioned in the above, a surface finish with a roughness average (RA) of up to 0.50 micro inches is acceptable. In presumption of the first and second contact surfaces each having an RA of 0.50 micro inches, an air-tightness property index of the two engaged contact surfaces can be acquired, and the threshold of the gap area can be determined accordingly. Here we assume the air-tightness property index is X, and the threshold derived from X is A. That is to say, when the gap area equals to A, the cover and base have an air-tightness property index same as the two engaged contact surfaces each having 0.50 micro inches RA. According to the method of measuring air-tightness of the embodiments of the invention, even if the first contact surface of the cover and/or the second contact surface of the base has an RA larger than 0.50 micro inches, as long as the gap area between the two surfaces is equal to or smaller than the threshold, the combination of the cover and the base can still achieve desired air-tightness. To be more specific, when the first contact surface of the cover has an RA far greater than 0.50 micro inches (say 5 micro inches, or higher) and the second contact surface of the base also has an RA far greater than 0.50 micro inches (say 5 micro inches, or higher), as long as the gap area between the two surfaces is equal to or smaller than the threshold A, the combination of the cover and base can achieve the expected air-tightness property index X. The cover and the base, each having an RA larger than 0.50 micro inches, can still be selected and be used to form the container. They are not limited by the restriction of 0.50 micro inches RA as described in the disclosure of related art. As a result, the requirement for flatness of the first contact surface and the second contact surface can be lowered, and thus the processing cost can be lowered as well. Moreover, the variation of air-tightness across different cover-and-base combinations can be reduced through the selectively matching process, and the consistency of air-tight property across different containers can be maintained.

Figure 17:
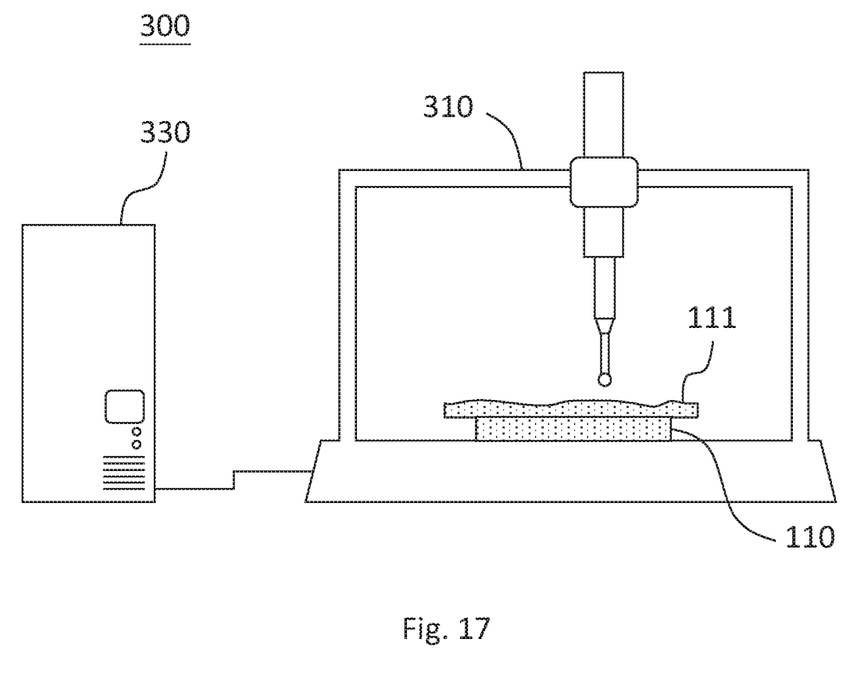
FIG. 17 is a schematic diagram showing a system of measuring air-tightness according to one embodiment of the invention.

Please refer to FIG. 17, which is a schematic diagram showing a system of measuring air-tightness according to one embodiment of the invention. The system 300 of measuring air-tightness is used for measuring a cover and a base. The cover has a first contact surface and the base has a second contact surface. The first contact surface is used for engaging with the second contact surface to form an air-tight state.

The system 300 includes a measuring unit 310 and a processing unit 330. The measuring unit 310 is used for acquiring a first contour curve relating to the first contact surface and a second contour curve relating to the second contact surface. The processing unit 330 is used for determining a gap area between the first contour curve and the second contour curve as the two contour curves are in contact with each other. The processing unit 330 is used for pairing the cover and the base as a combination of acceptable air-tightness when the gap area is equal to or smaller than a threshold, so as to form a container.

The measuring unit 310 sequentially obtains more than one first heights at a fixed interval from a first start point on the first contact surface. The measuring unit 310 also sequentially obtains more than one second heights at the same fixed interval from a second start point on the second contact surface.

The system 300 of the present embodiment can be exemplified by measuring previously mentioned first cover 110 and first base 120 as shown in FIGS. 2-10. When the first gap area A1 between the first contour curve C1 relating to the first contact surface 111 and the second contour curve C2 relating to the second contact surface 121 is larger than the threshold, the measuring unit 310 can be used to measure the second cover 210 to acquire the third contour curve C3 relating to the second cover 210. The processing unit 330 then determines the second gap area A2 between the third contour curve C3 and the second contour curve C2. When the first gap area A1 is larger than the threshold, alternatively, the measuring unit 310 can be used to measure the second base 220 to acquire the fourth contour curve C4 relating to the second base 220. The processing unit 330 then determines the third gap area A3 between the first contour curve C1 and the fourth contour curve C4. The technical details here are similar to the above mentioned embodiment of the method of measuring air-tightness, and will not be repeated herein.

In the present embodiment, the measuring unit 310 can be a coordinate measuring machine. Yet the present invention is not limited thereto, other measuring technics or devices that can obtain the heights at different locations on the first contact surface and on the second contact surface can be used in the present invention. The processing unit 330 can be a local computer, a remotely connected server, or other similar devices. Their contents or details are not limited in the present invention.

According to yet another embodiment of the invention, a container is provided. The container includes a cover and a base for cooperating with each other to contain a reticle. The cover has a first contact surface and the base has a second contact surface for engaging with the first contact surface to form an air-tight state. The cover and the base of the present embodiment container are paired through a method of measuring air-tightness (e.g. the method shown in FIG. 1a-1c) or a system of measuring air-tightness (e.g. the system 300 shown in FIG. 17) in the above-mentioned embodiments. Their contents and details are similar to those of the container 100 in the embodiment accompanying FIG. 2, and will not be repeated herein.

The method and the system of measuring air-tightness and the container measured thereby of the embodiments of the present invention, determine the air-tightness of the two engaged contact surfaces by acquiring the contour curves of the surfaces. After the first contour curve relating to the first contact surface of the cover and the second contour curve relating to the second contact surface of the base are acquired, the two contour curves are brought into contact with each other. The gap area between the two contour curves is then determined. When the gap area is equal to or smaller than the threshold, the cover and the base are paired as a combination of acceptable air-tightness, so as to form the container. By measuring the contour curves of the engaged surfaces and determining the gap area, the air-tightness measuring efficiency can be improved. When the air-tightness fails to meet the requirements, another cover or another base can be used to conduct air-tightness measuring. The problem of the cost increment due to wasting the container as the cover-base-combination fails the air-tightness test can be avoided. Further, the variation of air-tightness across different cover-and-base combinations can be reduced through the selectively matching process, and the consistency of air-tightness across different containers can be maintained.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

What is claimed is:

1. A method of measuring air-tightness, comprising:
    providing a first cover and a first base for cooperating with each other, wherein the first cover has a first contact surface and the first base has a second contact surface for engaging with the first contact surface to form an air-tight state;
    measuring a first contour curve, wherein the first contour curve is a full measurement of the contour of the first contact surface;
    measuring a second contour curve, wherein the second contour curve is a full measurement of the contour of the second contact surface;
    bringing the first contour curve into contact with the second contour curve after the first contour curve and the second contour curve are measured;
    calculating, based on the first and the second contour curves that are matched with each other, to determine a first gap area between the first contour curve and the second contour curve; and
    pairing the first cover and the first base as a first combination of acceptable air-tightness when the first gap area is determined to be equal to or smaller than a threshold, thereby forming a first container.

2. The method according to claim 1, wherein the step of acquiring the first contour curve relating to the first contact surface comprises:
    defining a first start point on the first contact surface; and
    sequentially obtaining a plurality of first heights at a fixed interval by following a first measuring path on the first contact surface starting from the first start point, wherein the first contour curve is acquired based on the first heights.

3. The method according to claim 2, wherein the step of acquiring the second contour curve relating to the second contact surface comprises:
    defining a second start point on the second contact surface; and
    sequentially obtaining a plurality of second heights at the fixed interval by following a second measuring path on the second surface starting from the second start point, wherein the second contour curve is acquired based on the second heights.

4. The method according to claim 3, wherein when the first contact surface is engaged with the second contact surface, the first start point overlaps with the second start point and the first measuring path overlaps with the second measuring path.

5. The method according to claim 1, further comprising:
    providing a second cover for pairing with the first base when the first gap area is larger than the threshold, wherein the second cover has a third contact surface.

6. The method according to claim 5, further comprising:
    measuring a third contour curve, wherein the third contour curve is a full measurement of the contour of the third contact surface;
    bringing the third contour curve into contact with the second contour curve after the second contour curve and the third contour curve are acquired;
    calculating, based on the second and the third contour curves that are matched with each other, to determine a second gap area between the third contour curve and the second contour curve; and
    pairing the second cover and the first base as a second combination of acceptable air-tightness when the second gap area is determined to be equal to or smaller than the threshold, thereby forming a second container.

7. The method according to claim 1, further comprising:
    providing a second base for pairing with the first cover when the first gap area is larger than the threshold, wherein the second base has a fourth contact surface.

8. The method according to claim 7, further comprising:
    measuring a fourth contour curve, wherein the fourth contour curve is a full measurement of the contour of the fourth contact surface;
    bringing the fourth contour curve into contact with the first contour curve after the fourth contour curve and the first contour curve are acquired;
    calculating, based on the first and the fourth contour curves that are matched with each other, to determine a third gap area between the fourth contour curve and the first contour curve; and
    pairing the first cover and the second base as a third combination of acceptable air-tightness when the third gap area is determined to be equal to or smaller than the threshold, thereby forming a third container.

9. A system of measuring air-tightness of a cover having a first contact surface and a base having a second contact surface for engaging with the first contact surface to form an air-tight state, the system comprising:
- a measuring unit for measuring a first contour curve and a second contour curve, wherein the first contour curve is a full measurement of the contour of the first contact surface and the second contour curve is a full measurement of the contour of the second contact surface; and
- a processing unit for performing a calculation to determine a gap area between the first contour curve and the second contour curve as the two contour curves are brought into contact with each other after the first contour curve and the second contour curve are measured;
- wherein the processing unit is used for pairing the cover and the base as a combination of acceptable air-tightness when the gap area is determined to be equal to or smaller than a threshold.

10. A container comprising a cover and a base for cooperating with each other to contain a reticle therewithin, wherein the cover has a first contact surface and the base has a second contact surface for engaging with the first contact surface to form an air-tight state, and the cover and the base are paired through a method of measuring air-tightness which comprises:
- measuring a first contour curve, wherein the first contour curve is a full measurement of the contour of the first contact surface;
- measuring a second contour curve, wherein the first contour curve is a full measurement of the contour of the first contact surface;
- bringing the first contour curve into contact with the second contour curve after the first contour curve and the second contour curve are measured;
- calculating, based on the first and the second contour curves that are matched with each other, to determine a gap area between the first contour curve and the second contour curve; and
- pairing the cover and the base as a combination of acceptable air-tightness when the gap area is determined to be equal to or smaller than a threshold, thereby forming the container.

* * * * *